US008742309B2

(12) United States Patent
Agranov et al.

(10) Patent No.: US 8,742,309 B2
(45) Date of Patent: Jun. 3, 2014

(54) IMAGERS WITH DEPTH SENSING CAPABILITIES

(75) Inventors: Gennadiy Agranov, San Jose, CA (US); Dongqing Cao, San Jose, CA (US); Junichi Nakamura, Tokyo (JP); Richard Scott Johnson, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 301 days.

(21) Appl. No.: 13/188,389

(22) Filed: Jul. 21, 2011

(65) Prior Publication Data

US 2012/0193515 A1    Aug. 2, 2012

Related U.S. Application Data

(60) Provisional application No. 61/437,245, filed on Jan. 28, 2011.

(51) Int. Cl.
*H01L 27/00*    (2006.01)

(52) U.S. Cl.
USPC .............. 250/208.1; 250/214.1; 348/273; 257/432; 257/440

(58) Field of Classification Search
USPC ............ 250/208.1, 214.1, 216, 226; 348/273, 348/281, 315; 257/432, 435, 440, 445
See application file for complete search history.

(56) References Cited

U.S. PATENT DOCUMENTS

| 6,856,407 B2 | 2/2005 | Knighton |
| 7,290,880 B1 | 11/2007 | Yaron |
| 2010/0020209 A1 | 1/2010 | Kim |
| 2010/0060717 A1 | 3/2010 | Gunnewiek |
| 2010/0123771 A1 | 5/2010 | Moon |
| 2010/0290674 A1 | 11/2010 | Kim |
| 2012/0019695 A1* | 1/2012 | Qian et al. ............ 348/273 |

OTHER PUBLICATIONS

Adelson and Wang, "Single Lens Stereo with a Plenoptic Camera", IEEE PAMI, vol. 14, No. 2, (Feb. 1992).
"An Objective Look at FSI and BSI", An Aptina Technology White Paper, 2010 (6 pages) [Retrieved on Jun. 18, 2012], Retrieved from the Internet <URL: http://www.aptina.com/news/FSI-BSI-WhitePaper.pdf>.
Agranov et al., U.S. Appl. No. 13/404,319, filed Feb. 24, 2012.
Agranov et al., U.S. Appl. No. 13/728,086, filed Dec. 27, 2012.

* cited by examiner

*Primary Examiner* — Kevin Pyo
(74) *Attorney, Agent, or Firm* — Treyz Law Group; Chih-Yun Wu

(57) ABSTRACT

An imager may include depth sensing pixels that provide an asymmetrical angular response to incident light. The depth sensing pixels may each include a substrate region formed from a photosensitive portion and a non-photosensitive portion. The depth sensing pixels may include mechanisms that prevent regions of the substrate from receiving incident light. Depth sensing pixel pairs may be formed from depth sensing pixels that have different asymmetrical angular responses. Each of the depth sensing pixel pairs may effectively divide the corresponding imaging lens into separate portions. Depth information for each depth sensing pixel pair may be determined based on the difference between output signals of the depth sensing pixels of that depth sensing pixel pair. The imager may be formed from various combinations of depth sensing pixel pairs and color sensing pixel pairs arranged in a Bayer pattern or other desired patterns.

13 Claims, 13 Drawing Sheets

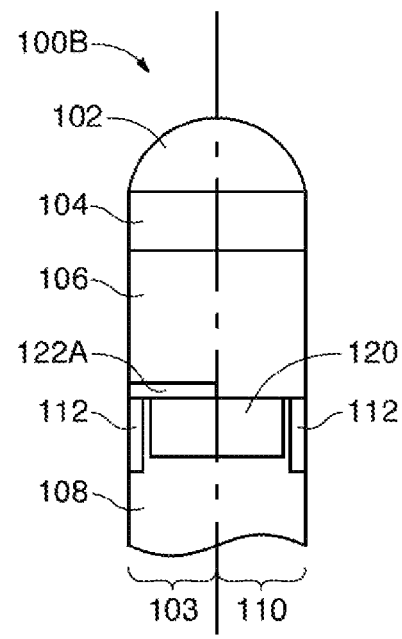
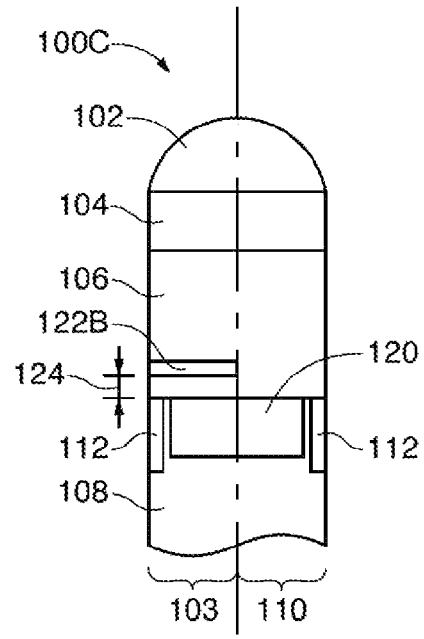
FIG. 4A    FIG. 4B
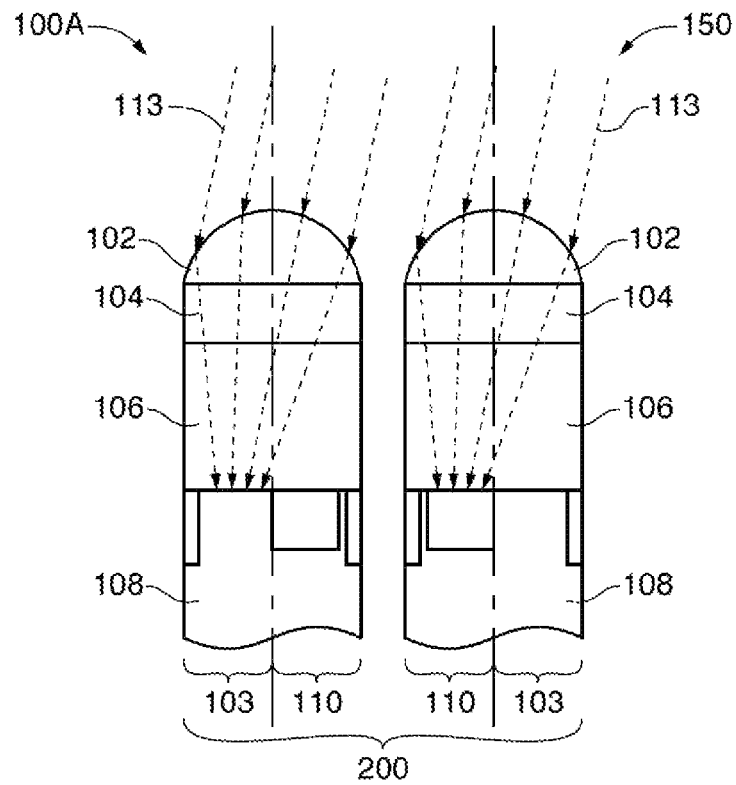
FIG. 5

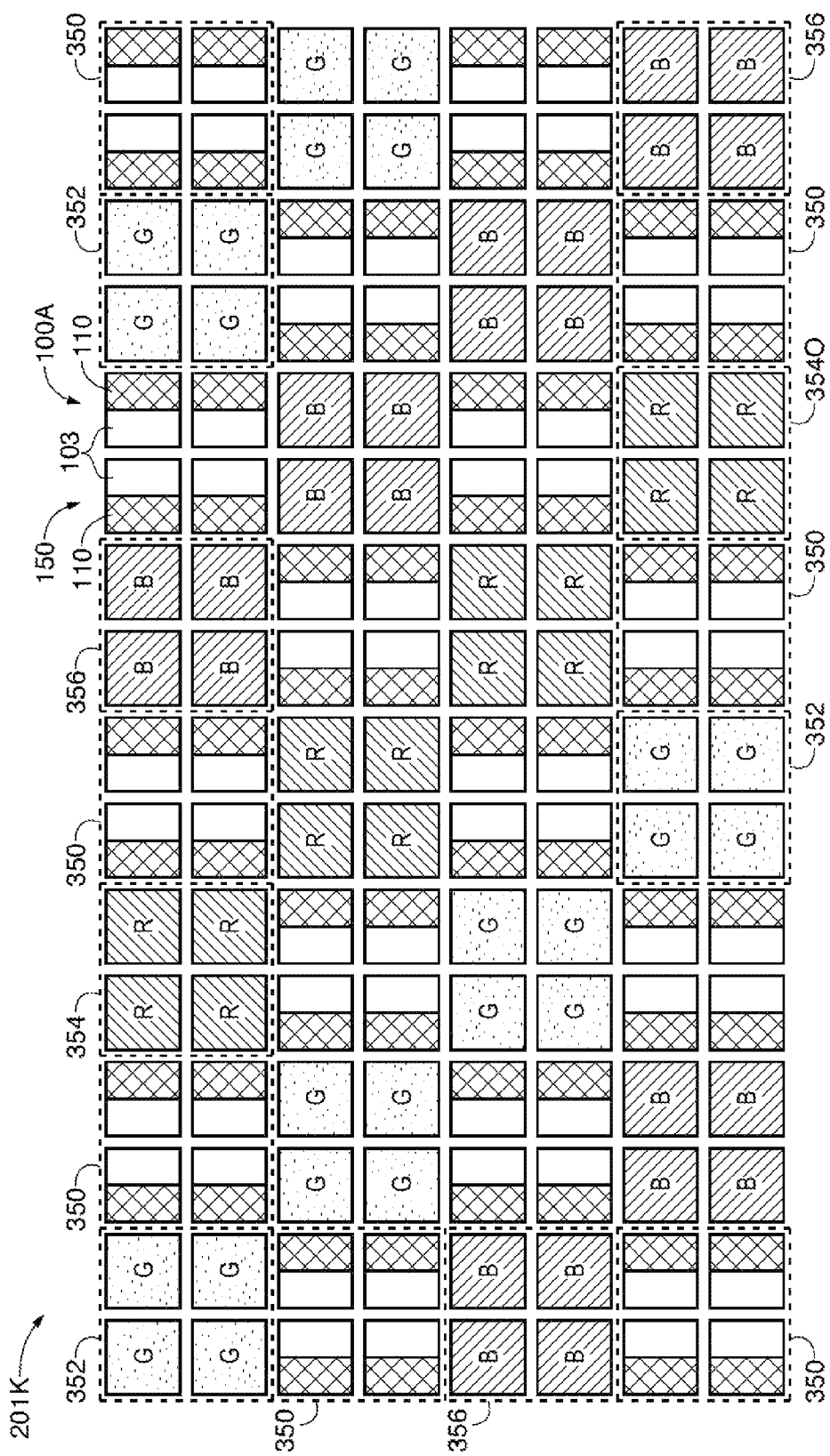

IMAGERS WITH DEPTH SENSING CAPABILITIES

This application claims the benefit of provisional patent application No. 61/437,245, filed Jan. 28, 2011, which is hereby incorporated by reference herein in its entirety.

BACKGROUND

This relates generally to imaging systems, and more particularly to imaging systems with depth sensing capabilities.

Modern electronic devices such as cellular telephones, cameras, and computers often use digital image sensors. Imagers (i.e., image sensors) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Some applications such as three-dimensional (3D) imaging may require electronic devices to have depth sensing capabilities. For example, to properly generate a 3D image for a given scene, an electronic device may need to identify the distances between the electronic device and objects in the scene. To identify distances, conventional electronic devices use complex arrangements. Some arrangements require the use of multiple image sensors that capture images from various viewpoints. Other arrangements require the addition of lenticular arrays that focus incident light on sub-regions of a two-dimensional pixel array. Due to the addition of components such as additional image sensors or complex lens arrays, these arrangements lead to reduced spatial resolution, increased cost and complexity.

It would therefore be desirable to design an improved imager with depth sensing capabilities.

BRIEF DESCRIPTION OF THE DRAWINGS

FIG. 4A is an illustrative cross-sectional view of a depth sensing pixel with a partial masking layer adjacent to a substrate in accordance with an embodiment of the present invention.

FIG. 4B is an illustrative cross-sectional view of a depth sensing pixel with a partial floating masking layer in accordance with an embodiment of the present invention.

FIG. 5 is a cross-sectional view of a depth sensing pixel pair in accordance with an embodiment of the present invention.

FIG. 9K is a diagram of an imager that may include depth sensing pixel groups that may be interposed between color sensing pixel groups and that may be arranged in a diagonal line pattern in accordance with an embodiment of the present invention.

DETAILED DESCRIPTION

Figure 1:
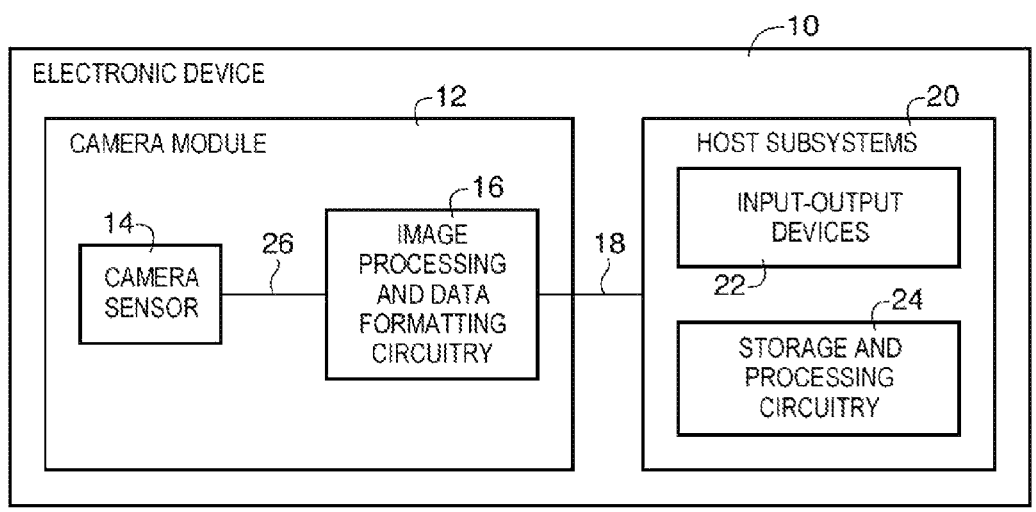
FIG. 1 is an illustrative schematic diagram of an electronic device with a camera sensor that may include depth sensing pixels in accordance with an embodiment of the present invention.

Embodiments of the present invention relate to image sensors with depth sensing capabilities. An electronic device with a digital camera module is shown in FIG. 1. Electronic device 10 may be a digital camera, a computer, a cellular telephone, a medical device, or other electronic device. Camera module 12 may include image sensor 14 and one or more lenses. During operation, the lenses focus light onto image sensor 14. Image sensor 14 includes photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from camera sensor 14 may be provided to image processing and data formatting circuitry 16 via path 26. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip or SOC arrangement, camera sensor 14 and image processing and data formatting circuitry 16 are implemented on a common integrated circuit. The use of a single integrated circuit to implement camera sensor 14 and image processing and data formatting circuitry 16 can help to minimize costs.

Camera module 12 (e.g., image processing and data formatting circuitry 16) conveys acquired image data to host subsystem 20 over path 18. Electronic device 10 typically provides a user with numerous high-level functions. In a computer or advanced cellular telephone, for example, a user may be provided with the ability to run user applications. To implement these functions, host subsystem 20 of electronic device 10 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, etc.

It may be desirable to form image sensors with depth sensing capabilities (e.g., to use in 3D imaging applications such as machine vision applications and other three dimensional imaging applications). To provide depth sensing capabilities, camera sensor 14 may include pixels such as pixel 100A shown in FIG. 2A.

Figures 2A, 2B, 2C:
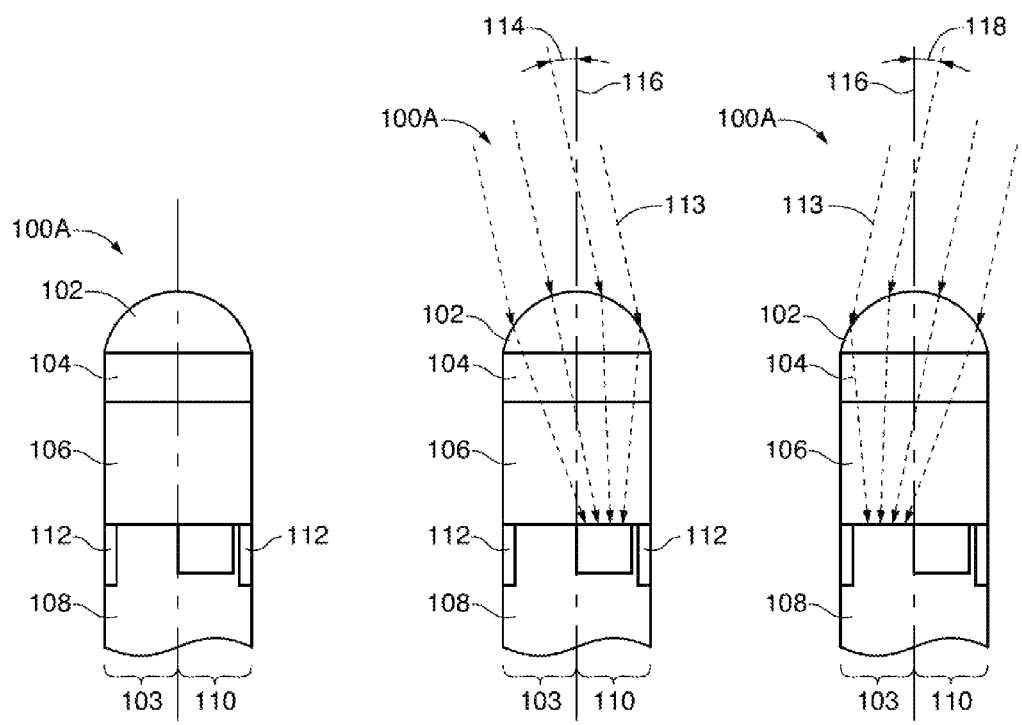
FIG. 2A is an illustrative cross-sectional view of a depth sensing pixel that has an asymmetric angular response in accordance with an embodiment of the present invention.
FIGS. 2B and 2C are illustrative cross-sectional views of a depth sensing pixel that may be asymmetrically sensitive to incident light at negative and positive angles of incidence in accordance with an embodiment of the present invention.

FIG. 2A shows an illustrative cross-section of pixel 100A. Pixel 100A may contain microlens 102, color filter 104, stack of dielectric layers 106, substrate layer 108, a photosensitive area such as photosensitive area 110 formed in substrate layer 108, and pixel separating areas 112 formed in substrate layer 108.

Microlens 102 may direct incident light towards a substrate area between pixel separators 112. Color filter 104 may filter the incident light by only allowing predetermined wavelengths to pass through color filter 104 (e.g., color filter 104 may only be transparent to the wavelengths corresponding to a green color). Photo-sensitive area 110 may serve to absorb incident light focused by microlens 102 and produce image signals that correspond to the amount of incident light absorbed.

Photosensitive area 110 may cover approximately half of the substrate area between pixel separators 112, as an example. By only covering half of the substrate area, pixel 100A may be provided with an asymmetric angular response (e.g., pixel 100A may produce different image signals based on the angle at which incident light reaches pixel 100A). The angle at which incident light reaches pixel 100A may be herein referred to as the incident angle or angle of incidence.

In the example of FIG. 2B, incident light 113 may originate from the left of a normal axis 116 and may reach pixel 100A with an angle 114 relative to normal axis 116. Angle 114 may be a negative angle of incident light. Incident light 113 that reaches microlens 102 at a negative angle such as angle 114 may be focused towards photosensitive area 110 and pixel 100A may produce relatively high image signals.

In the example of FIG. 2C, incident light 113 may originate from the right of normal axis 116 and reach pixel 100A with an angle 118 relative to normal axis 116. Angle 118 may be a positive angle of incident light. Incident light that reaches microlens 102 at a positive angle such as angle 118 may be focused towards an area of substrate 108 that is not photosensitive such as area 103 (e.g., the light is not focused towards photosensitive area 110). In this case, pixel 100A may produce an image signal output that is relatively low.

Figure 3:
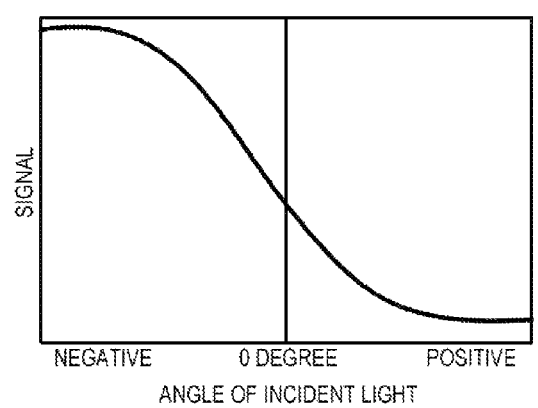
FIG. 3 is an illustrative diagram of illustrative signal outputs of a depth sensing pixel for incident light striking the depth sensing pixel at varying angles of incidence in accordance with an embodiment of the present invention.

Due to the asymmetric formation of photosensitive area 110 in substrate 108, pixel 100A may have an asymmetric angular response (e.g., pixel 100A may produce different signal outputs for incident light with a given intensity based on an angle of incidence). In the diagram of FIG. 3, an example of the image signal output of a pixel 100A in response to varying angles of incident light is shown. As shown in FIG. 3, pixel 100A may produce larger image signals for negative angles of incident light and smaller image signals for positive angles of incident light. In other words, pixel 100A produces larger image signals as the incident angle becomes more negative.

FIGS. 4A and 4B show alternate embodiments for depth sensing pixels with asymmetric angular responses. In FIG. 4A, a pixel 100B is provided that may contain a photosensitive area 120 that covers substantially all of the available area in substrate 108 between pixel separators 112. To provide an asymmetric angular response, pixel 100B may be formed with an opaque layer 122A that covers approximately half of photosensitive area 120. Opaque layer 122A may be formed from metals, dielectric materials, or any desirable opaque material (e.g., a material that prevents light from reaching photosensitive layer 120). Opaque layer 122A is shown as covering the left half of photosensitive area 120, but it should be understood that opaque layer 122A may cover any desirable half (or portion) of photosensitive area 120.

The embodiment of FIG. 4B illustrates a pixel 100C in which the opaque layer 122A may be formed at a distance 124 above photosensitive area 120. Distance 124 may be chosen for manufacturing purposes, performance, or other desirable purposes.

In the arrangements of FIGS. 4A and 4B, opaque layer 122 may serve to prevent incident light from reaching the region of photosensitive area 120 beneath opaque layer 122. The photosensitive region underneath opaque layer 122 may receive minimal light and pixels 100B and 100C may effectively produce the same angular response of pixel 100A shown in FIG. 3. The photosensitive region blocked by opaque layer 122 may produce approximately the same image signal as a non-photosensitive region (e.g., a minimal image signal).

The portion (e.g., half) of substrate 108 that is sensitive to light may be chosen to provide pixels with output image signals that depend on the angle of incident light. FIG. 5 illustrates an adjacent pair of pixels (100A and 150) with the photosensitive half of pixel 100A formed on the right side of pixel 100A and the photosensitive half of pixel 150 formed on the left side of pixel 150. An adjacent pair of pixels such as pixels 100A and 150 may be referred to herein as a pixel pair 200.

Incident light 113 that reaches adjacent pixels 100A and 150 may have an angle of incidence that is approximately equal for both pixels. In the arrangement of FIG. 5, incident light 113 may be focused by microlens 102 onto the right side of substrate 108 in pixel 100A and the left side of substrate 108 in pixel 150. In response to receiving incident light 113, pixel 100A may produce an output image signal that is low and pixel 150 may produce an output image signal that is high (e.g., because the left side of substrate 108 in pixel 100A is not photosensitive and the left side of substrate 108 in pixel 150 contains photosensitive area 110).

The relative locations of pixels 100A and 150 within pixel pair 200 may be reversed without significantly affecting the operation of pixel pair 200. For example, pixel 100A may be located on the right and pixel 150 may be located on the left.

The size and location of photosensitive areas 110 (e.g., as shown in FIGS. 2A, 4A, 4B, and 5) is merely illustrative. As examples, the edges of photosensitive areas 110 for pixels 100A and 150 may be located at the centers of pixels 100A and 150 (as shown in FIGS. 2A, 4A, 4B, and 5) or may be shifted slightly away from the centers of pixels 100A and 150 in any direction. The edges of photosensitive areas 110 for pixels 100A may, if desired, be shifted away from the centers of pixels 100A in the same direction or in the opposite direction that the edges of photosensitive areas 110 for pixels 150 are shifted, in arrangements in which the edges of photosensitive areas 110 for both pixels 100A and 150 are shifted slightly away from the centers of pixels 100A and 150. If desired, photosensitive areas 110 may also be increased in size to cover more than half of the pixel area or decreased in size to cover less than half of the pixel area.

Figure 6:
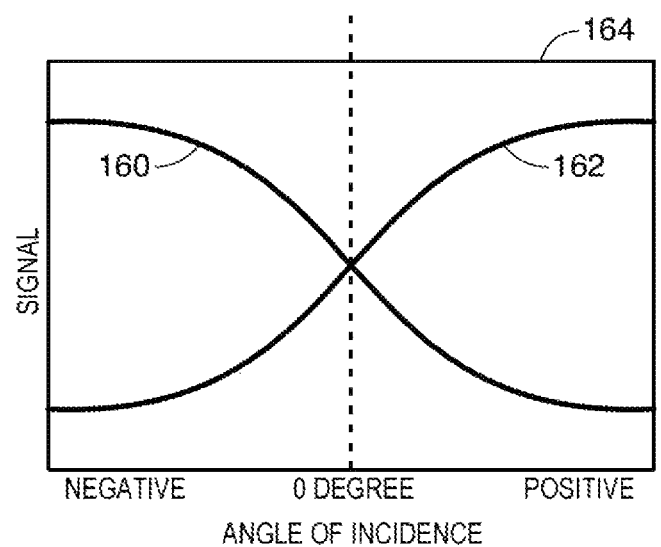
FIG. 6 is an illustrative diagram of illustrative signal output signals of depth sensing pixels in a depth sensing pixel pair for incident light striking the depth sensing pixel pair at varying angles of incidence in accordance with an embodiment of the present invention.

The respective output image signals for pixel pair 200 (e.g., adjacent pixels 100A and 150) are shown in FIG. 6. Line 160 may reflect the output image signal for pixel 100A and line 162 may reflect the output image signal for pixel 150. For negative angles of incidence, the output image signal for pixel 100A may increase (because incident light is focused onto photosensitive area 110 of pixel 100A) and the output image signal for pixel 150 may decrease (because incident light is focused away from photosensitive area 110 of pixel 150). For positive angles of incidence, the output image signal for pixel 100A may be relatively small and the output image signal for pixel 150 may be relatively large (e.g., the output signal from pixel 100A may decrease and the output signal from pixel 150 may increase).

Line 164 of FIG. 6 may reflect the sum of the output signals for pixel pair 200. As shown in FIG. 6, line 164 may remain relatively constant regardless of the angle of incidence (e.g., for any given angle of incidence, the total amount of light that is absorbed by the combination of pixels 100A and 150 may be constant).

Figure 7A:
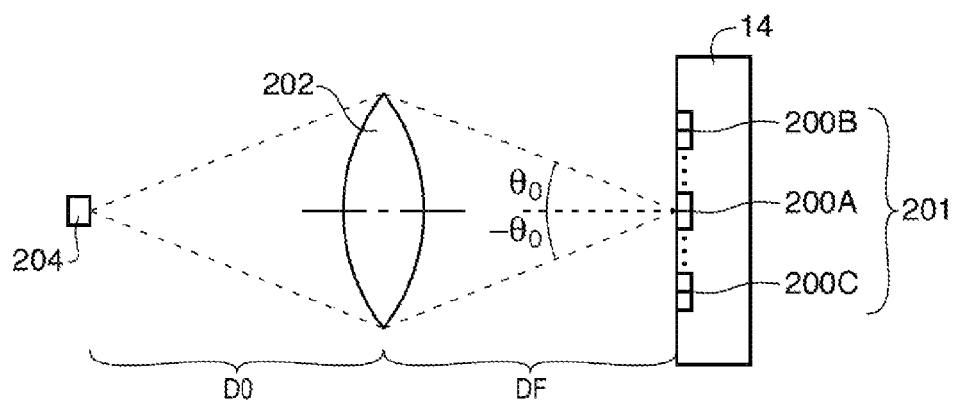
FIG. 7A is an illustrative diagram of a depth sensing imager having a lens and of an object located at a focal distance away from the lens showing how the lens focuses light from the object onto the depth sensing imager in accordance with an embodiment of the present invention.
Figure 7B:
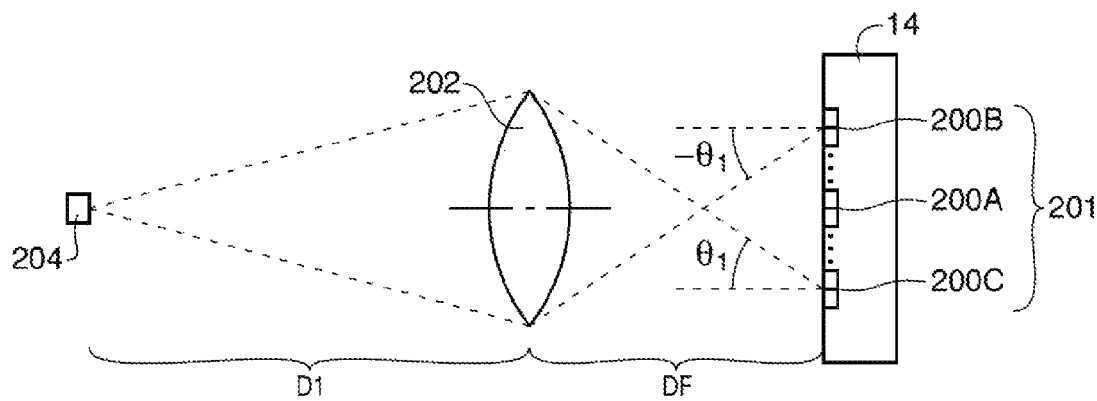
FIG. 7B is an illustrative diagram of a depth sensing imager having a lens and of an object located at more than a focal distance away from the lens showing how the lens focuses light from the object onto the depth sensing imager in accordance with an embodiment of the present invention.
Figure 7C:
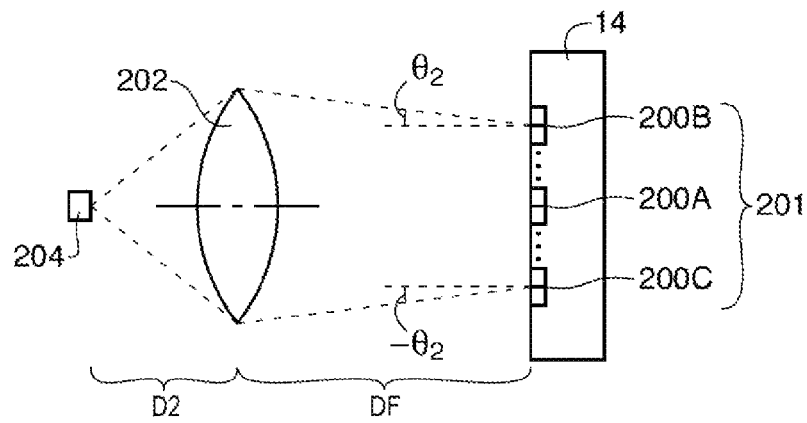
FIG. 7C is an illustrative diagram of a depth sensing imager having a lens and of an object located less than a focal distance away from the imaging lens showing how the lens focuses light from the object onto the depth sensing imager in accordance with an embodiment of the present invention.

Pixel pairs 200 may be used to form imagers with depth sensing capabilities. FIGS. 7A, 7B, and 7C show illustrative image sensors 14 with depth sensing capabilities. As shown in FIGS. 7A, 7B, and 7C, image sensor 14 may contain an array of pixels 201 formed from pixel pairs 200 (e.g., pixel pairs 200A, 200B, 200C, etc.).

Image sensor 14 may have an associated camera lens 202 that focuses light originating from a scene of interest (e.g., a scene that includes an object 204) onto the array of pixels. Camera lens 202 may be located at a distance DF from image sensor 14. Distance DF may correspond to the focal length of camera lens 202.

In the arrangement of FIG. 7A, object 204 may be located at distance D0 from camera lens 202. Distance D0 may correspond to a focused object plane of camera lens 202 (e.g., a plane located at a distance D0 from camera lens 202). The focused object plane and a plane corresponding to image sensor 14 may sometimes be referred to as conjugate planes. In this case, light from object 204 may be focused onto pixel pair 200A at an angle $\theta_0$ and an angle $-\theta_0$ and the image signal outputs of pixels 100A and 150 of pixel pair 200 may be equal (e.g., most of the light is absorbed by pixel 100A for the positive angle and most of the light is absorbed by pixel 150 for the negative angle).

In the arrangement of FIG. 7B, object 204 may be located at a distance D1 from camera lens 202. Distance D1 may be larger than the distance of the focused object plane (e.g., the focused object plane corresponding to distance D0) of camera lens 202. In this case, some of the light from object 204 may be focused onto pixel pair 200B at a negative angle $-\theta_1$ (e.g., the light focused by the bottom half of camera lens 202) and some of the light from object 204 may be focused onto pixel pair 200C at a positive angle $\theta_1$ (e.g., the light focused by the top half of camera lens 202).

In the arrangement of FIG. 7C, object 204 may be located at a distance D2 from camera lens 202. Distance D2 may be smaller than the distance of the focused object plane (e.g., the focused object plane corresponding to distance D0) of camera lens 202. In this case, some of the light from object 204 may be focused by the top half of camera lens 202 onto pixel pair 200B at a positive angle $\theta_2$ and some of the light from object 204 may be focused by the bottom half of camera lens 202 onto pixel pair 200C at a negative angle $-\theta_2$.

The arrangements of FIGS. 7A, 7B, and 7C may effectively partition the light focused by camera lens 202 into two halves split by a center plane at a midpoint between the top of the lens pupil and the bottom of the lens pupil (e.g., split into a top half and a bottom half). Each pixel in pixel array 201 other than center pixels of pixel pair 200A may only receive light from one of the two halves of lens 202 for objects at any distance. For example, for an object at distance D1, pixel 200B only receives light from the bottom half of lens 202. For an object at distance D2, pixel 200B only receives light from the top half of lens 202. The partitioning of the light focused by camera lens 202 may be referred to herein as lens partitioning or lens pupil division.

The output image signals of each pixel pair 200 of image sensor 14 may depend on the distance from camera lens 202 to object 204. The angle at which incident light reaches pixel pairs 200 of image sensor 14 depends on the distance between lens 202 and objects in a given scene (e.g., the distance between objects such as object 204 and device 10).

Figure 8:
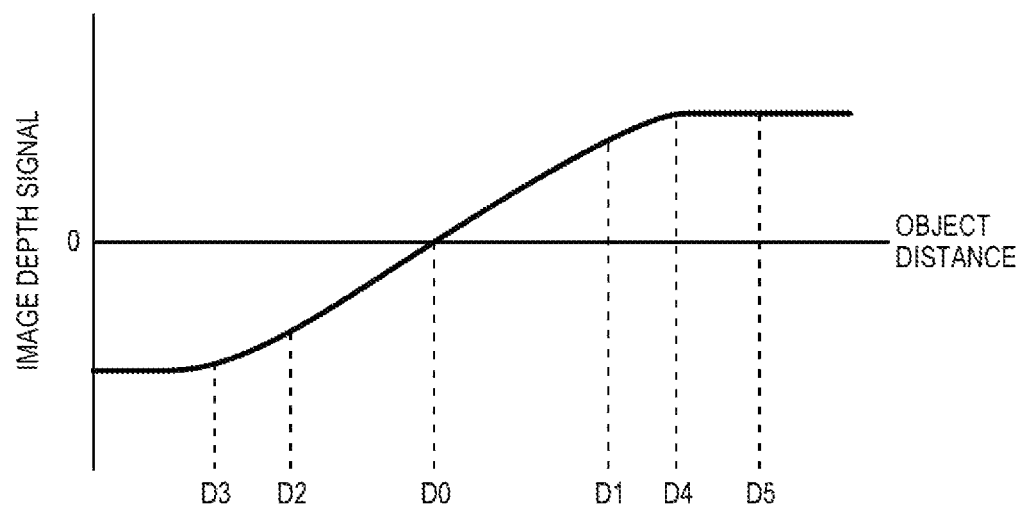
FIG. 8 is an illustrative diagram of illustrative depth signal outputs of a depth sensing pixel pair for an object at varying distances from the depth sensing pixel in accordance with an embodiment of the present invention.

An image depth signal may be calculated from the difference between the two output image signals of each pixel pair 200. The diagram of FIG. 8 shows an image depth signal that may be calculated for pixel pair 200B by subtracting the image signal output of pixel 150 from the image signal output of pixel 100A (e.g., by subtracting line 162 from line 160 of FIG. 6). As shown in FIG. 8, for an object at a distance that is less than distance D0, the image depth signal may be negative. For an object at distance that is greater than the focused object distance D0, the image depth signal may be positive.

For distances greater than D4 and less than D3, the image depth signal may remain constant. Pixels 100A and 150 may be unable to resolve incident angles with magnitudes larger than the magnitudes of angles provided by objects at distances greater than D4 or at distances less than D3). In other words, a depth sensing imager may be unable to accurately measure depth information for objects at distances greater than D4 or at distances less than D3. The depth sensing imager may unable to distinguish whether an object is at a distance D4 or a distance D5 (as an example). If desired, the depth sensing imager may assume that all objects that result in an image depth signal equivalent to distance D2 or D4 are at a distance of D2 or D4, respectively (e.g., the imager may identify objects located at distances such as D2 as being at distance D4 and objects located closer than distance D3 as being at distance D3).

To provide an imager 14 with depth sensing capabilities, two dimensional pixel arrays 201 may be formed from various combinations of depth sensing pixel pairs 200 and regular pixels (e.g., pixels without asymmetric angular responses). The embodiments of FIGS. 9A-9K show top-down views of illustrative arrays formed from combinations of depth sensing pixel pairs and conventional pixels.

Figure 9A:
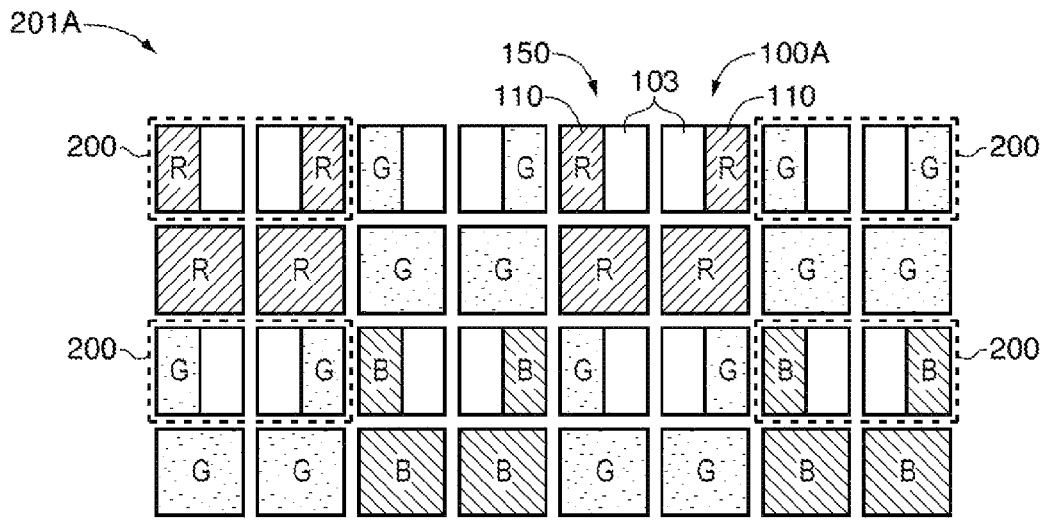
FIG. 9A is an illustrative diagram of an imager that may include alternating rows of depth sensing pixel pairs and color sensing pixels in accordance with an embodiment of the present invention.

Pixel array 201A shown in FIG. 9A may have groups of pixels arranged in a Bayer pattern (e.g., alternating red pixel groups and green pixel groups followed by alternating green and blue pixel groups). Each pixel pair 200 may be formed horizontally, with a depth sensing pixel 150 on the left and a depth sensing pixel 100A on the right. In the arrangement of FIG. 9A, the image signals from each row containing depth sensing pixels may be used to provide depth information. The image signals from each row containing regular pixels may be used to provide image information such as image color information. If desired, charge binning may be performed on adjacent pixels of the same color to increase the signal to noise ratio of output image signals (e.g., the output signals of adjacent red pixels in the first row and the first two columns may be combined). If desired, adjacent pixels may share pixel output structures (e.g., adjacent pixels may share floating diffusion (FD) regions to perform both separate signal readout and charge binning functions, may share reset transistors, may share address transistors, may share source-follower transistors, etc.).

Figure 9B:
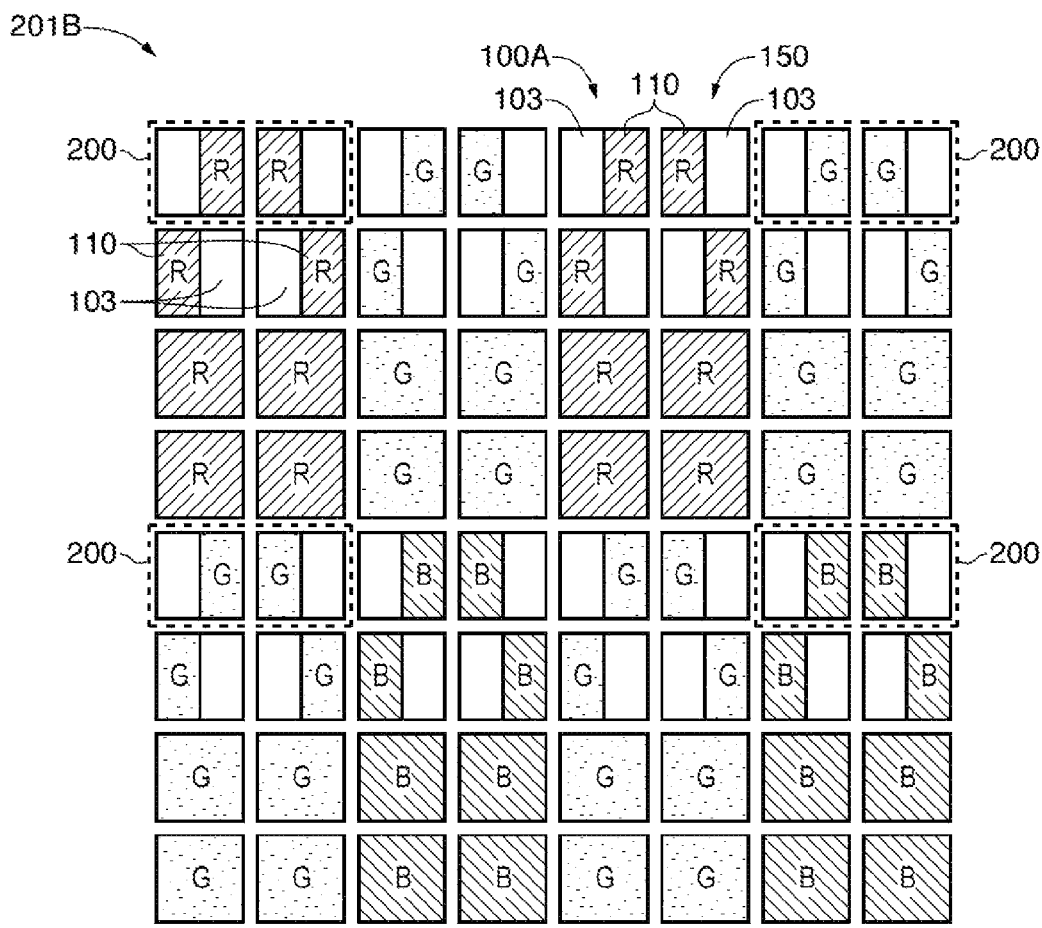
FIG. 9B is an illustrative diagram of an imager that may include alternating pairs of rows of depth sensing pixel groups and color sensing pixel groups in accordance with an embodiment of the present invention.

Pixel array 201B shown in FIG. 9B may have two rows of depth sensing pixel pairs followed by two rows of normal pixels, etc. Each pixel pair 200 may be formed horizontally, with a depth sensing pixel 150 on the left and a depth sensing pixel 100A on the right (or with a depth sensing pixel 150 on the right and a depth sensing pixel 100A on the left). In this embodiment, four neighboring pixels of the same color may be combined to form a single output signal. For example, the four red depth-sensing pixels of the first two rows and first two columns may be combined to form a single depth signal output and the four normal green pixels of the last two rows and first two columns may be combined for form a single green image signal output. If desired, pixel groups with a 2-by-2 shared architecture (e.g., pixel groups marked by dashed circles 250 on FIGS. 9C and 9E-9I) can perform binning operations by summing charges stored in shared floating diffusion (FD) nodes.

Figure 9C:
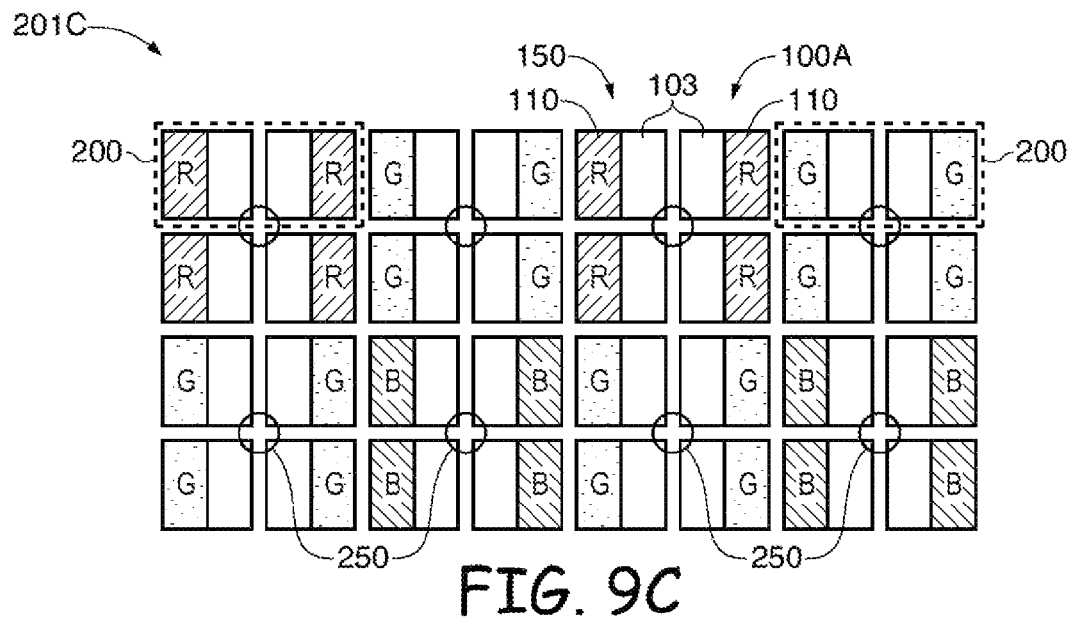
FIG. 9C is an illustrative diagram of an imager that may include depth sensing pixel pairs that may be arranged in a Bayer pattern in accordance with an embodiment of the present invention.

In FIG. 9C, a pixel array 201C may be formed from only depth sensing pixel pairs. Each pixel pair 200 may be formed horizontally, with a depth sensing pixel 150 on the left and a depth sensing pixel 100A on the right. The pixel pairs of pixel array 201C (and arrays 201A, 201B, 201D, 201H, 201I, 201J, and 201K) may be referred to herein as horizontal depth sensing pixel pairs. In this arrangement, a lens 202 used to focus light onto pixel array 201C may be horizontally partitioned (e.g., the resulting lens pupil division may be horizontal). In this case, the distance to an object may be determined from light originating from either the left side of the lens pupil or the right side of the lens pupil.

Color information may be obtained from each pixel pair 200 from the sum of the output signals from depth sensing pixel 150 and 100A of that pixel pair 200. For example, image processing and data formatting circuitry 16 may be used to combine the output signals from the depth sensing pixels of each pixel pair 200 to obtain a regular two-dimensional color image. As another example, charge summing between the depth sensing pixels of each pixel pair 200 may be used to combine the light collected by each depth sensing pixel.

Figure 9D:
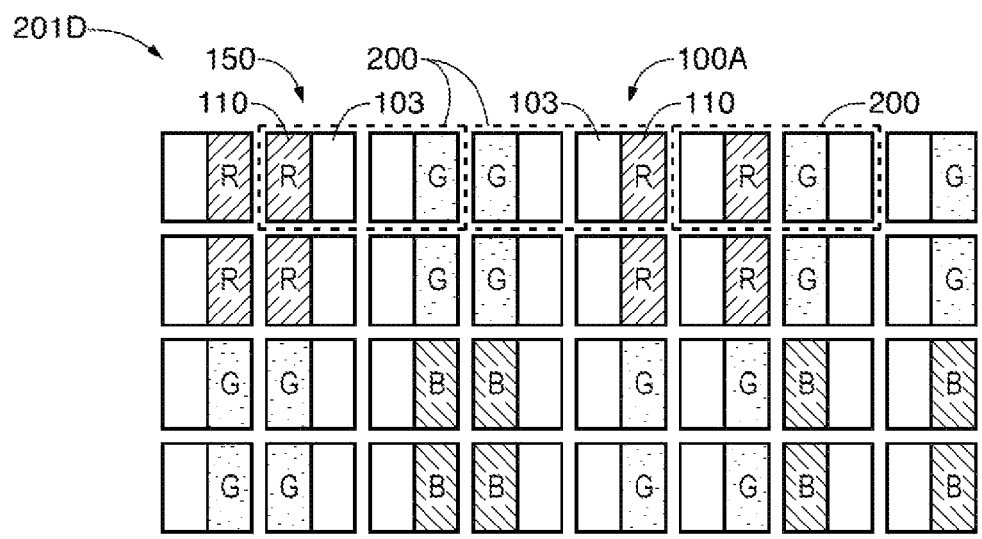
FIG. 9D is an illustrative diagram of an imager that may include depth sensing pixel pairs that may be formed from pixels of different colors in accordance with an embodiment of the present invention.

In FIG. 9D, a pixel array 201D may be formed from only depth sensing pixel pairs. In the arrangement of FIG. 9D, depth sensing pixel pairs may be formed from pixels of different colors. For example, a first depth sensing pixel pair 203 may be formed from a red pixel of the first row and second column and a green pixel of the first row and third column.

Figure 9E:
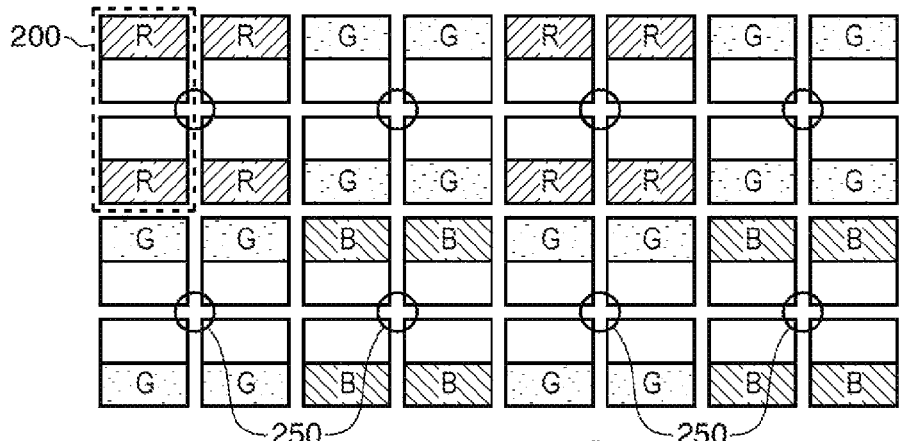
FIG. 9E is an illustrative diagram of an imager that may include depth sensing pixel pairs that may provide vertical lens splitting in accordance with an embodiment of the present invention.

In FIG. 9E, a pixel array 201E may be formed from depth sensing pixel pairs. Each pixel pair 200 may be formed vertically, with a depth sensing pixel 150 on the top and a depth sensing pixel 100A on the bottom. The pixel pairs of pixel array 201E may be referred to herein as vertical depth sensing pixel pairs. In this arrangement, a lens 202 used to focus light onto pixel array 201C may be vertically partitioned into a top portion and a bottom portion (e.g., the resulting lens pupil division may be vertical). In this case, the distance to an object may be determined from light originating from either the top half of the lens pupil or the bottom half of the lens pupil.

It may be desirable to provide lens pupil division along two separate axes. In some scenarios, lens pupil division along a single axis (e.g., vertical division or horizontal division) may provide insufficient depth sensing capabilities. For example, an imager with pixel array 201C that partitions a corresponding lens 202 horizontally may be unable to accurately detect a thin and flat object that lies in a horizontal plane, and an imager with pixel array 201E that partitions a lens 202 vertically may be unable to detect a thin and flat object that lies in a vertical plane.

Figure 9F:
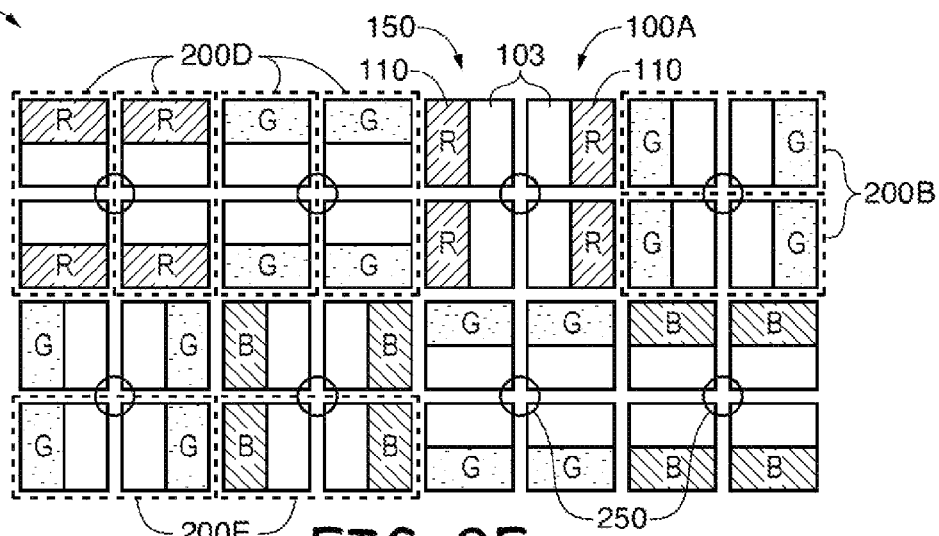
FIG. 9F is an illustrative diagram of an imager that may include depth sensing pixel pairs that may provide vertical lens splitting and depth sensing pixel pairs that may provide horizontal lens splitting in accordance with an embodiment of the present invention.

In the illustrative arrangement of FIG. 9F, an imager may be formed from a combination of vertical pixel pairs and horizontal pixel pairs. The vertical pixel pairs 200D may be formed that provide lens pupil division along a first axis (e.g., pixels 200D may partition a corresponding lens 202 along a vertical axis). The horizontal pixel pairs 200E may be formed that provide lens pupil division along a second axis (e.g., pixels 200E may partition a corresponding lens 202 along a horizontal axis). By combining vertical pixel pairs and horizontal pixel pairs, the imager of FIG. 9F may provide improved depth sensitivity (e.g., by using a combination of vertical and horizontal pixel pairs, the imager may provide depth sensitivity to objects that lie in vertical and horizontal planes).

Figure 9G:
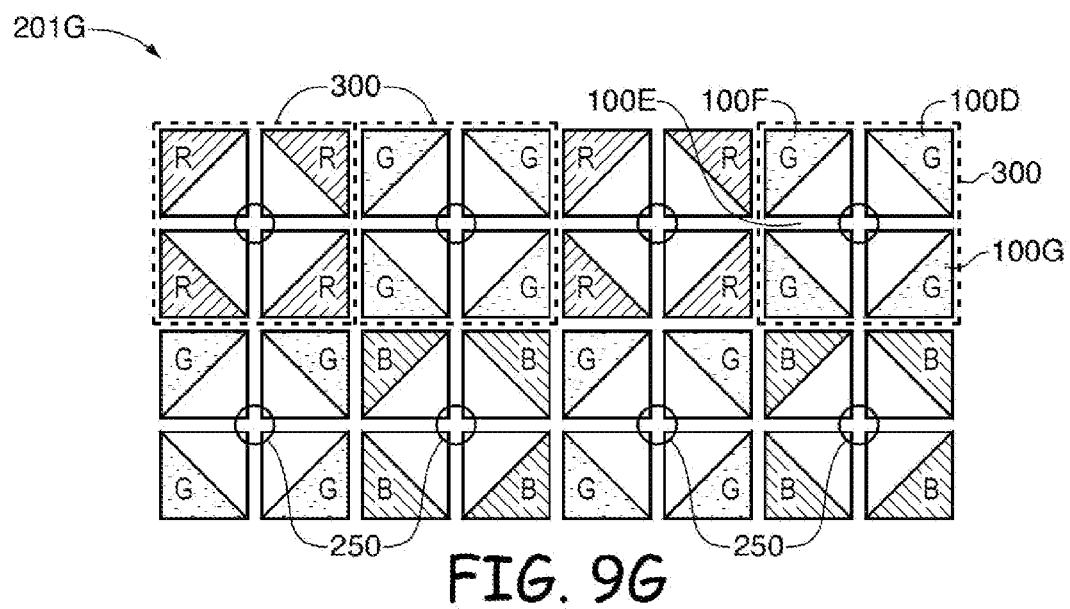
FIG. 9G is an illustrative diagram of an imager that may include depth sensing pixel pairs that may provide diagonal lens splitting in accordance with an embodiment of the present invention.

In the illustrative arrangement of FIG. 9G, an imager 201G may be formed from a combination of diagonally split pixel pairs. As shown in FIG. 9G, pixel groups 300 may be formed from four pixels. Each pixel group 300 may include pixels 100D, 100E, 100F, and 100G of a desired color (e.g., the pixels of each pixel group may be formed with color filters that pass predetermined wavelengths of light).

Each pixel 100D may be diagonally divided into an upper-right photosensitive portion and a lower-left non-photosensitive portion. Each pixel 100E may be diagonally divided into a lower-left photosensitive portion and an upper-right non-photosensitive portion. Each pixel 100F may be diagonally divided into an upper-left photosensitive portion and a lower-right photosensitive portion. Each pixel 100G may be diagonally divided into a lower-right photosensitive portion and an upper-left non-photosensitive portion.

Pixel 100D may be formed in a top right corner of each pixel group 300. Pixel 100E may be formed in a lower left corner of each pixel group 300 (e.g., pixel 100E may be formed diagonally opposite to pixel 100D). Pixels 100D and 100E may form a pixel pair that provides diagonal lens pupil division along a first diagonal axis (e.g., pixels 100D and 100E may divide an associated imaging lens into a top right portion and a bottom left portion).

Pixel 100F may be formed in a top left corner of each pixel group 300. Pixel 100G may be formed in a Pixels 100D and 100E may form a first pixel pair that provides diagonal lens pupil division along a second diagonal axis (e.g., pixels 100F and 100G may divide an associated imaging lens into a top left portion and a bottom right portion).

By forming imager 201G with pixel groups that provide diagonal lens pupil division, the imager may have improved depth sensitivity for scenes with objects that substantially lie in a diagonal axis (e.g., the diagonal axis of the first pixel pair or the second pixel pair).

Figure 9H:
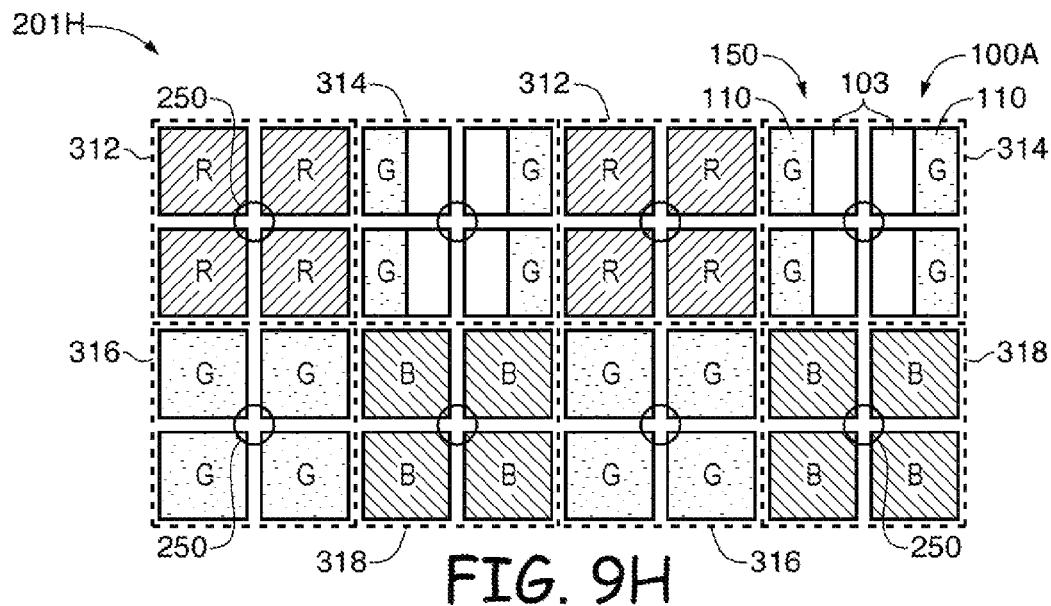
FIG. 9H is an illustrative diagram of an imager that may include depth sensing pixel groups that may replace selected color sensing pixel groups in selected rows of red color sensing pixels in accordance with an embodiment of the present invention.

FIG. 9H shows an illustrative imager 201H that contains pixel groups arranged in a Bayer pattern (e.g., rows of red pixel groups 312 and green pixel groups 314 alternating with rows of green pixel groups 316 and blue pixel groups 318). Each pixel group may contain four pixels of the same color (e.g., a red pixel group may contain four red pixels, a green pixel group may contain four green pixels, and a blue pixel group may contain four blue pixels). In the example of FIG. 9H, green pixel groups 314 (e.g., the green pixel groups in rows with the red pixel groups) may provide lens pupil division. For example, green pixel groups 314 may be formed from pixel pairs 200 that provide horizontal lens pupil division, vertical lens pupil division, or other desirable lens pupil division schemes.

Figure 9I:
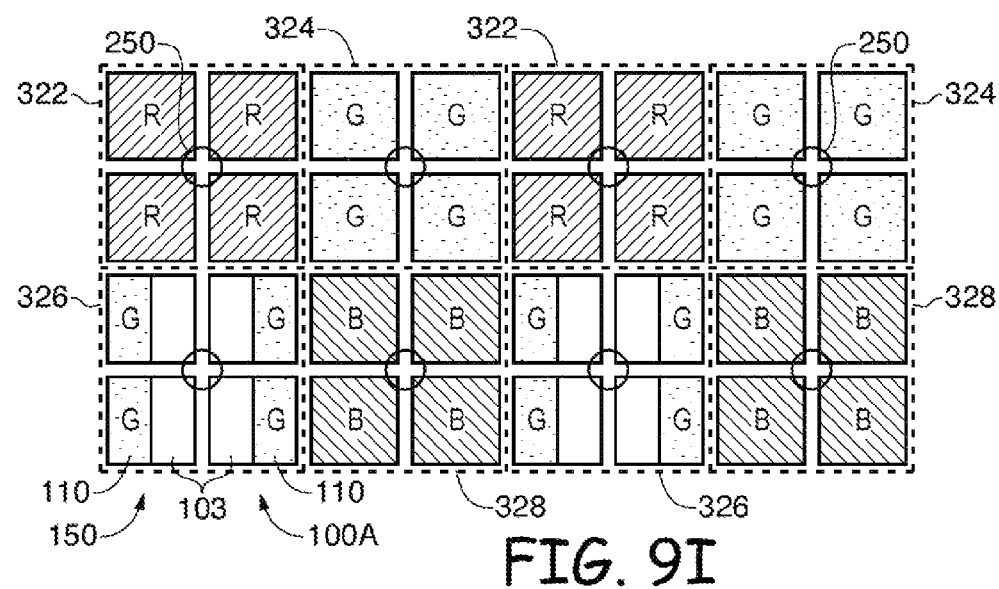
FIG. 9I is a diagram of an imager that may include depth sensing pixel groups that may replace selected color sensing pixel groups in selected rows with blue color sensing pixels in accordance with an embodiment of the present invention.

FIG. 9I shows an illustrative imager 201I that contains pixel groups arranged in a Bayer pattern. Each pixel group may contain four pixels of the same color (e.g., a red pixel group may contain four red pixels, a green pixel group may contain four green pixels, and a blue pixel group may contain four blue pixels). Imager 201I may include rows of red pixel groups 322 and green pixel groups 324 alternating with rows of green pixel groups 326 and blue pixel groups 328. Green pixel groups 326 (e.g., the green pixel groups in rows with the blue pixel groups) may provide lens pupil division. For example, green pixel groups 326 may be formed from pixel pairs 200 that provide horizontal lens pupil division, vertical lens pupil division, or other desirable lens pupil division schemes.

To provide normal color images from the imagers of FIG. 9H and FIG. 9I, the output signals from each pixel in a pixel group may be combined. For example, four pixels from a red pixel group 322 may be summed to provide a single red output signal for red pixel group 322, four pixels from a green pixel group 324 may be summed to provide a single green output signal for green pixel group 324, four pixels from a green pixel group 326 may be summed to provide a single green output signal for green pixel group 326, and four pixels from a blue pixel group 328 may be summed to provide a single blue output signal for blue pixel group 328. Output signals from each pixel in a pixel group may be combined using shared floating diffusion regions, analog charge summing, digital summing, or any other desired method of combining output signals from groups of pixels.

To provide three dimensional images (3D images) from the imagers of FIG. 9H and FIG. 9I, the output signals from each depth sensing pixel may be used. For example, the difference between pixel outputs of two or more depth sensing pixels may be used to determine depth information.

It should be understood that the depth sensing pixels shown in previous embodiments may be formed with any desirable types of color filters. Depth sensing pixels may be formed with red color filters, blue color filters, green color filters, or color filters that pass other desirable wavelengths of light such as infrared and ultraviolet light wavelengths. If desired, depth sensing pixels may be formed with color filters that pass multiple wavelengths of light. For example, to increase the amount of light absorbed by a depth sensing pixel, the depth sensing pixel may be formed with a color filter that passes many wavelengths of light. As another example, the depth sensing pixel may be formed without a color filter (sometimes referred to as a clear pixel).

Figure 9J:
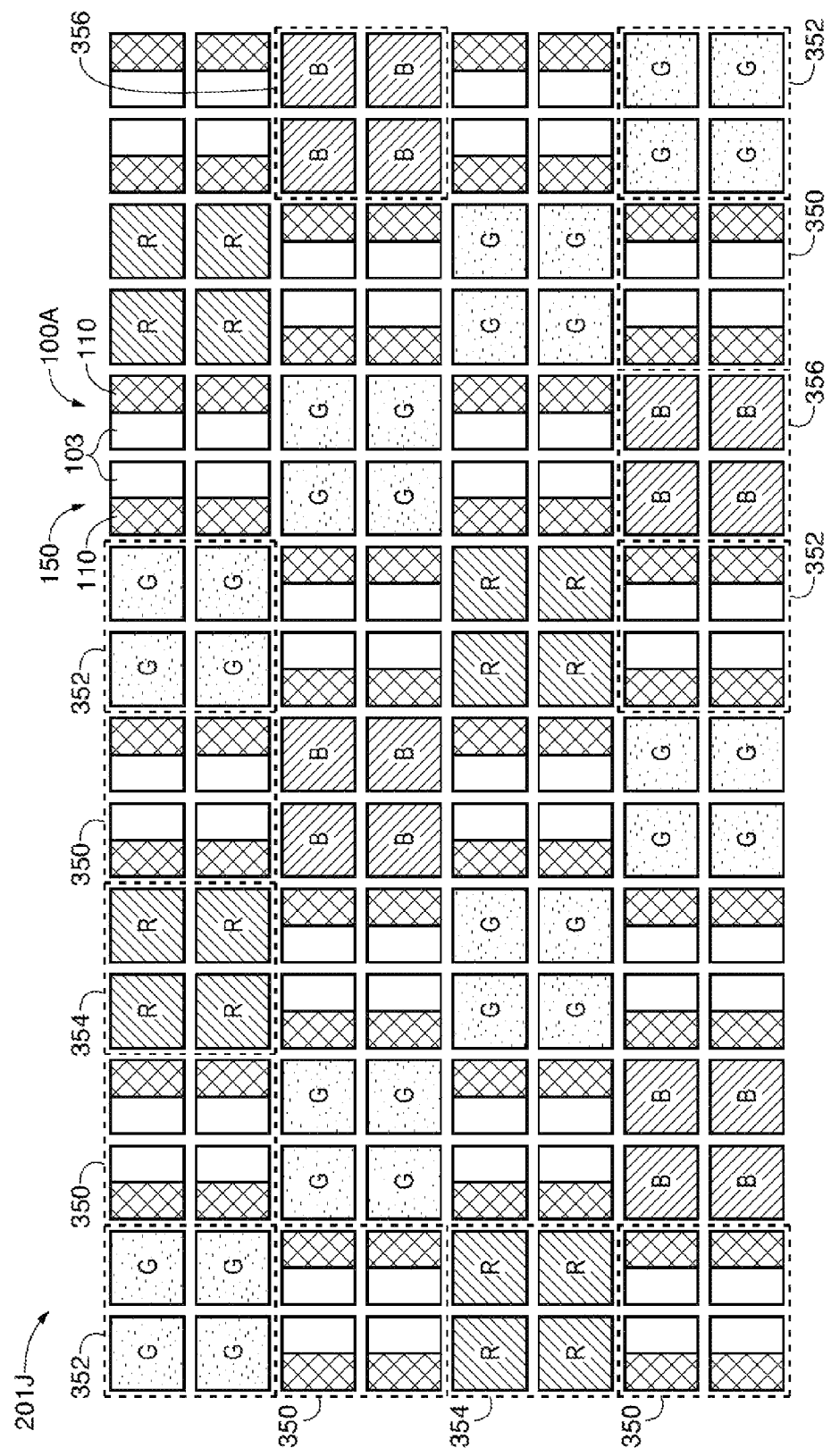
FIG. 9J is a diagram of an imager that may include depth sensing pixel groups interposed between color sensing pixel groups that may be arranged in a Bayer pattern in accordance with an embodiment of the present invention.

FIG. 9J shows an illustrative imager 201J with depth sensing pixel groups 350 interposed between normal color sensing pixel groups that are arranged in a Bayer pattern. Each pixel group may contain four pixels of the same color. As shown in FIG. 9J, imager 201J may include rows of green color pixel groups 352, depth sensing pixel groups 350, and red color pixel groups 354 alternating with rows of depth sensing pixel groups 350, green color pixel groups 352, and blue color pixel groups 356.

Depth sensing pixel groups 350 may absorb relatively large ranges of wavelengths (e.g., depth sensing pixel groups 350 may absorb many colors other than those corresponding to green, blue, or red wavelengths).

FIG. 9K shows an illustrative imager 201K with depth sensing pixel groups 350 interposed between green pixel groups 352, red pixel groups 354, and blue pixel groups 356. As shown in FIG. 9K, each row of imager 201K may contain a repeated pattern of green color pixel groups 352, red color pixel groups 354, and blue color pixel groups 356 with depth sensing pixel groups 350 interposed between each adjacent pair of color pixel groups. For example, the first row may include a green color pixel group 352 followed by a first depth sensing pixel group 350, red color pixel group 354, a second depth sensing pixel group 350, and a blue color pixel group 356.

Various embodiments have been described illustrating imagers with depth sensing capabilities.

An imager may include pixels that receive incident light and convert the received light into electrical signals. The imager may have an associated imaging lens that focuses incident light onto the imager. The pixels may include color sensing pixels and depth sensing pixels. Each of the pixels may include a microlens that focuses incident light through a color filter onto a substrate region. The depth sensing pixels may provide an asymmetrical angular response to incident light.

The substrate region of the depth sensing pixels may be formed from a photosensitive portion and a non-photosensitive portion to provide an asymmetrical angular response to incident light. Each of the depth sensing pixels may include mechanisms that reduce the amount of incident light received by regions of the substrate through the corresponding microlens.

Depth sensing pixel pairs may be formed from depth sensing pixels that have relatively inverted asymmetrical angular responses. Each of the depth sensing pixel pairs may effectively divide the corresponding imaging lens pupil into separate portions. A first depth sensing pixel of a given depth sensing pixel pair may receive incident light from a first portion of the corresponding imaging lens pupil. A second depth sensing pixel of the given depth sensing pixel pair may receive incident light from a second portion of the corresponding imaging lens pupil.

Depth information for each depth sensing pixel pair may be determined based on the difference between output signals of the first and second depth sensing pixels of that depth sensing pixel pair. Color information for each depth sensing pixel pair may be determined from a summation of output signals of the first and second depth sensing pixels of that depth sensing pixel pair.

The imager may be formed from various combinations of depth sensing pixel pairs and color sensing pixels. The depth sensing pixel pairs may replace selected color sensing pixels to form a Bayer pattern or other desirable patterns. The depth sensing pixel pairs may be interposed between color sensing pixel pairs.

The foregoing is merely illustrative of the principles of this invention and various modifications can be made by those skilled in the art without departing from the scope and spirit of the invention.

What is claimed is:

1. An imager comprising:
at least one pair of imaging pixels, wherein the at least one pair of imaging pixels comprises first and second pixels each having a different and asymmetrical angular response to incident light.

2. The imager defined in claim 1 wherein the first and second pixels of the at least one pair of imaging pixels each comprise a photosensitive region and a non-photosensitive region.

3. The imager defined in claim 1 further comprising a lens operable to focus the incident light on the at least one pair of imaging pixels.

4. The imager defined in claim 3 wherein the at least one pair of imaging pixels is operable to perform horizontal lens splitting on the lens.

5. The imager defined in claim 3 wherein the at least one pair of imaging pixels is operable to perform vertical lens splitting on the lens.

6. The imager defined in claim 3 wherein the at least one pair of imaging pixels is operable to perform diagonal lens splitting on the lens.

7. The imager defined in claim 1 wherein the first pixel comprises a color filter operable to pass a set of wavelengths of the incident light and wherein the second pixel comprises a color filter operable to pass the set of wavelengths of the incident light.

8. The imager defined in claim 1 wherein the first pixel of the first pixel pair comprises a first color filter operable to pass a first set of wavelengths of the incident light, wherein the second pixel of the first pixel pair comprises a second color filter operable to pass a second set of wavelengths of the incident light.

9. The imager defined in claim 1 further comprising at least one imaging pixel that has a symmetrical angular response to incident light.

10. Circuitry that receives incident light at an angle, the circuitry comprising:
at least one pair of imaging pixels, wherein the at least one pair of imaging pixels comprises first and second pixels each of which produces an output that varies based on the angle of the incident light, wherein the output produced by the first pixel increases as the angle of the incident light increases, and wherein the output produced by the second pixel decreases as the angle of the incident light increases.

11. The circuitry defined in claim 10 wherein the at least one pair of imaging pixels comprises a plurality of pairs of imaging pixels arranged in a Bayer pattern.

12. The circuitry defined in claim 11 wherein the first and second pixels of the at least one pair of imaging pixels each comprise a photosensitive region and a non-photosensitive region.

13. The circuitry defined in claim 10 further comprising at least one circuit configured to produce a two-dimensional color image by combining the output produced by the first pixel with the output produced by the second pixel.

* * * * *